US012593559B2

(12) United States Patent
Chen et al.

(10) Patent No.: US 12,593,559 B2
(45) Date of Patent: Mar. 31, 2026

(54) ORGANIC/INORGANIC COMPOSITE STRUCTURE, METHOD FOR MANUFACTURING THE SAME AND SENSING DEVICE

(71) Applicant: National Cheng Kung University, Tainan City (TW)

(72) Inventors: Chia-Yun Chen, Tainan City (TW); Jheng-Yi Li, Kaohsiung City (TW); Tsung-Yen Wu, Changhua County (TW)

(73) Assignee: National Cheng Kung University, Tainan City (TW)

( * ) Notice: Subject to any disclaimer, the term of this patent is extended or adjusted under 35 U.S.C. 154(b) by 369 days.

(21) Appl. No.: 18/227,323

(22) Filed: Jul. 28, 2023

(65) Prior Publication Data

US 2024/0414931 A1 Dec. 12, 2024

(30) Foreign Application Priority Data

Jun. 8, 2023 (TW) ................................. 112121343

(51) Int. Cl.
H10K 39/00 (2026.01)
H10K 39/30 (2026.01)
H10K 71/12 (2023.01)
(52) U.S. Cl.
CPC .......... H10K 39/501 (2023.02); H10K 39/30 (2023.02); H10K 71/12 (2023.02)
(58) Field of Classification Search
None
See application file for complete search history.

*Primary Examiner* — Jeffrey D Washville
(74) *Attorney, Agent, or Firm* — Winston Hsu

(57) ABSTRACT

An organic/inorganic composite structure includes a silicon substrate and a conductive polymer layer. The silicon substrate includes a plurality of microstructures disposed on a surface of the silicon substrate. The conductive polymer layer is disposed on the plurality of microstructures. A spaced distance is between the conductive polymer layer and the surface of the silicon substrate.

19 Claims, 10 Drawing Sheets

~100

A silicon substrate is provided — 110

A conductive polymer layer is formed on a plurality of microstructures — 120

Two conductive electrodes are formed on a surface of the conductive polymer layer away from the plurality of microstructures — 130

ORGANIC/INORGANIC COMPOSITE STRUCTURE, METHOD FOR MANUFACTURING THE SAME AND SENSING DEVICE

BACKGROUND OF THE INVENTION

1. Field of the Invention

The present disclosure relates to a composite structure, a method for manufacturing the same and a sensing device having the same, and more particularly, to an organic/inorganic composite structure, a method for manufacturing the same and a sensing device having the same.

2. Description of the Prior Art

With the vigorous development of cutting-edge technologies, such as the Internet of Things, edge computing, and artificial intelligence, the development of related technologies, such as sensors and wireless communication technologies, has been jointly driven. In the related technologies of cutting-edge technology, sensors are used to collect front-end data. The sufficiency and correctness of the data collected by sensors are critical to the accuracy of subsequent analysis. Therefore, how to improve the properties of the sensors, such as reducing the manufacturing cost and/or improving the sensitivity, has become an important issue for the relevant industry.

SUMMARY OF THE INVENTION

According to one embodiment of the present disclosure, an organic/inorganic composite structure includes a silicon substrate and a conductive polymer layer. The silicon substrate includes a plurality of microstructures disposed on a surface of the silicon substrate. The conductive polymer layer is disposed on the plurality of microstructures. A spaced distance is between the conductive polymer layer and the surface of the silicon substrate.

According to another embodiment of the present disclosure, a method for manufacturing an organic/inorganic composite structure includes steps as follows. A silicon substrate is provided. The silicon substrate includes a plurality of microstructures disposed on a surface of the silicon substrate. A conductive polymer layer is formed on the plurality of microstructures. A spaced distance is between the conductive polymer layer and the surface of the silicon substrate.

According to yet another embodiment of the present disclosure, a sensing device includes the aforementioned organic/inorganic composite structure.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom or top is used with reference to the orientation of the Figure(s) being described. The elements of the present disclosure can be positioned in a number of different orientations. As such, the directional terminology is used for purposes of illustration and is in no way limiting. In addition, identical numeral references or similar numeral references are used for identical elements or similar elements in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

It is understood that, although the terms first, second, etc. may be used herein to describe various elements, regions, layers and/or sections, these elements, regions, layers and/or sections should not be limited by these terms. These terms may be only used to distinguish one element, region, layer and/or section from another element, region, layer and/or section. Terms such as "first," "second," and other numerical terms when used herein do not imply a sequence or order unless clearly indicated by the context. Thus, a first element, region, layer and/or section discussed below could be termed a second element, region, layer and/or section without departing from the teachings of the embodiments. The terms used in the claims may not be identical with the terms used in the specification, but may be used according to the order of the elements claimed in the claims.

<Method for Manufacturing Organic/Inorganic Composite Structure>

Figure 1:
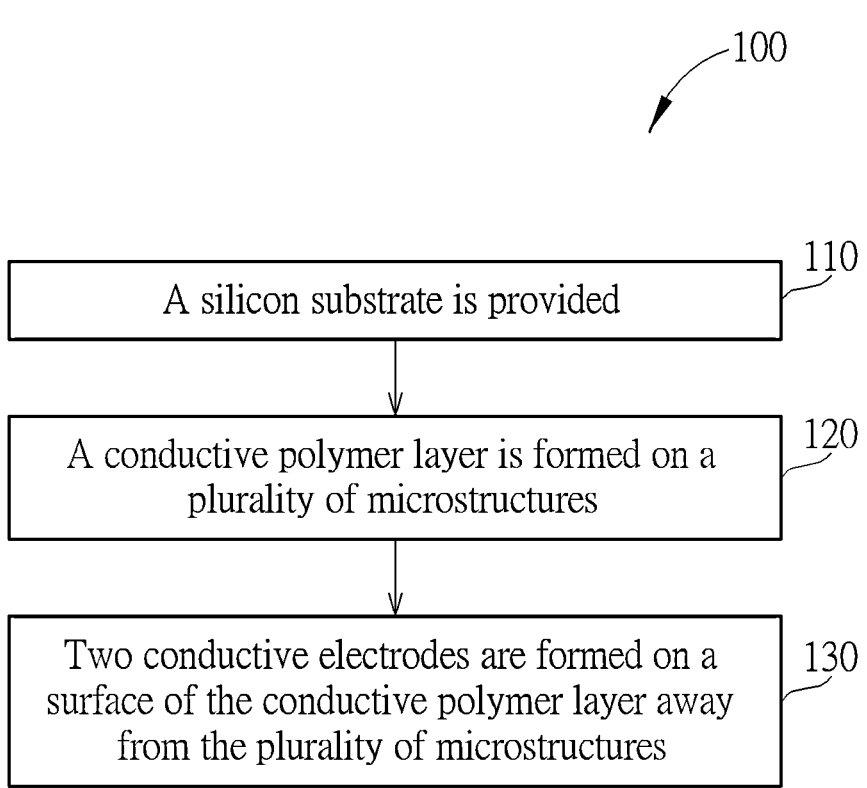
FIG. 1 is a flow diagram of a method for manufacturing an organic/inorganic composite structure according to one embodiment of the present disclosure.
Figure 2:
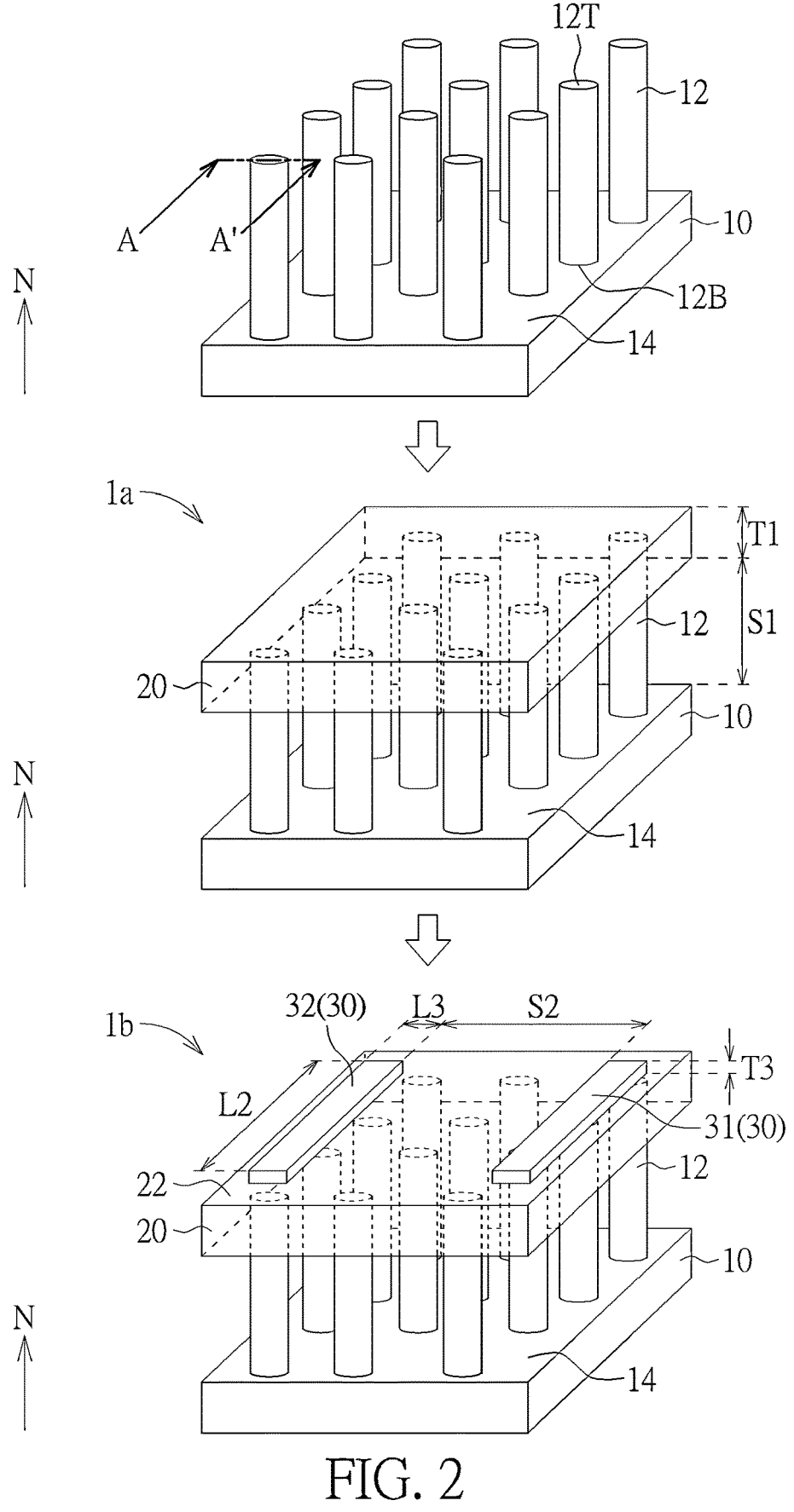
FIG. 2 is a schematic diagram showing steps of the method for manufacturing the organic/inorganic composite structure shown in FIG. 1.

Please refer to FIG. 1 and FIG. 2. FIG. 1 is a flow diagram of a method 100 for manufacturing an organic/inorganic composite structure according to one embodiment of the present disclosure. FIG. 2 is a schematic diagram showing steps of the method 100 for manufacturing the organic/inorganic composite structure shown in FIG. 1. The method 100 for manufacturing the organic/inorganic composite structure includes Step 110 and Step 120, and can optionally include Step 130. In Step 110, a silicon substrate 10 is provided. The silicon substrate 10 includes a plurality of microstructures 12. The plurality of microstructures 12 are disposed on a surface 14 of the silicon substrate 10. In Step 120, a conductive polymer layer 20 is formed on the plurality of microstructures 12, wherein a spaced distance S1 is between the conductive polymer layer 20 and the surface 14 of the silicon substrate 10. In Step 130, two conductive electrodes 30 are formed on a surface 22 of the conductive polymer layer 20 away from the plurality of microstructures 12, wherein the two conductive electrodes 30 are spaced apart with each other.

Specifically, the silicon substrate 10 can be an n-type silicon substrate, and the material of the conductive polymer layer 20 can include a p-type conductive polymer. Thereby, a p-n heterostructure can be formed. Moreover, with the spaced distance S1 between the conductive polymer layer 20 and the surface 14 of the silicon substrate 10, the absorption of photons can be effectively increased, which is beneficial to the separation of electron holes and electrons. In other embodiments, the silicon substrate 10 can be a p-type silicon substrate, and the material of the conductive polymer layer 20 can include an n-type conductive polymer, which can also form a p-n heterostructure. In other words, one of the silicon substrate 10 and the conductive polymer layer 20 being p-type and the other of the silicon substrate 10 and the conductive polymer layer 20 being n-type is within the scope of the present disclosure.

The aforementioned "the surface 14 of the silicon substrate 10" refers to a surface that a bottom end 12B of the microstructure 12 directly contacts. Specifically, the conductive polymer layer 20 is located at a top end 12T of the microstructure 12, and the surface 14 of the silicon substrate 10 is located at the bottom end 12B of the microstructures 12.

Figure 3:
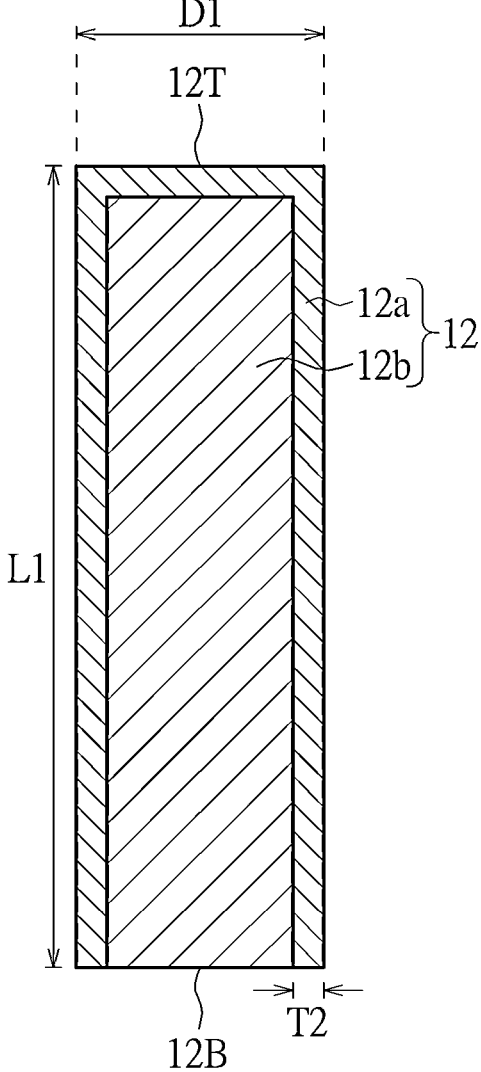
FIG. 3 is a schematic cross-sectional view showing a microstructure according to one embodiment of the present disclosure.

Please refer to FIG. 3, which is a schematic cross-sectional view showing a microstructure 12 according to one embodiment of the present disclosure, and the viewing angle thereof corresponds to the section line A-A' in FIG. 2. In FIG. 3, the portion from the top end 12T to the bottom end 12B of the microstructure 12 is shown, and the portion below the surface 14 of the silicon substrate 10 is omitted.

In FIG. 2 and FIG. 3, the microstructure 12 is a nanowire with an oxide layer 12a. For example, the nanowire can be a linear nanowire. The diameter D1 of the nanowire can be 20 nm to 25 nm, and the length L1 of the nanowire can be 350 nm to 450 nm, but not limited thereto. By arranging the linear nanowires on the surface 14 of the silicon substrate 10, the surface area can be increased. In other embodiments, the microstructures 12 can be curved nanowires, or pyramidal, cylindrical or moth-eye microstructures, so as to increase the surface area. The microstructure 12 may have an oxide layer 12a. The oxide layer 12a may be formed on a surface (not labeled) of the microstructure 12, and a thickness T2 of the oxide layer 12a may be 2.5 nm to 3 nm. With the microstructure 12 having the oxide layer 12a, and the thickness T2 of the oxide layer 12a being in a specific range, it is beneficial to form the heterostructure, so as to increase the energy barrier at the interface. As a result, the organic/inorganic composite structure 1a, 1b of the present disclosure is closer to an ideal diode. Accordingly, it is beneficial to the separation of electrons and electron holes in the excitation state, which is beneficial to improve the responsivity of the subsequently formed organic/inorganic composite structure 1a and 1b to energy in a specific range. That is, it is beneficial to apply the organic/inorganic composite structure 1a or 1b to a sensing device.

Figure 4:
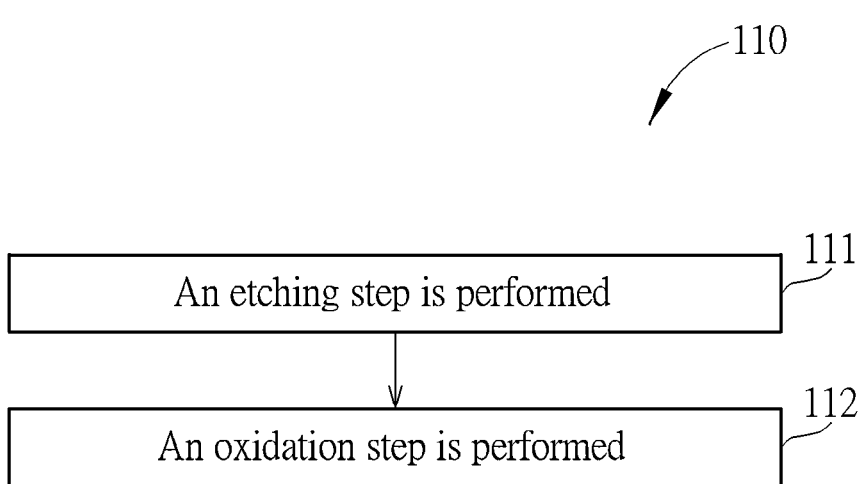
FIG. 4 is a flow diagram of Step 110 according to one embodiment of the present disclosure.

The following exemplarily illustrates how to manufacture the silicon substrate 10. Please refer to FIG. 4, which is a flow diagram of Step 110 according to one embodiment of the present disclosure. Step 110 may include Step 111, and may optionally include Step 112. In Step 111, an etching step is performed, wherein a plurality of microstructures 12 are formed on the surface 14 of the silicon substrate 10. In Step 112, an oxidation step is performed, wherein a portion of at least one of the plurality of microstructures 12 is oxidized to form an oxide layer 12a. Thereby, the microstructures 12 can be integrally formed on the silicon substrate 10, and at least one of the microstructures 12 include the oxide layer 12a and a non-oxidized portion 12b. The non-oxidized portion 12b can include silicon, and the oxide layer 12a can include an oxide of silicon. A chemical formula of the oxide of silicon can be $SiO_x$, wherein x is 1.56 to 1.58.

Step 111 can be a metal-assisted chemical etching process. For example, the silicon substrate without the microstructures 12 (hereinafter, the initial silicon substrate) can be placed in a mixed solution containing silver nitrate and hydrofluoric acid for performing the etching step. Before performing Step 111, a cleaning step may be performed. For example, the initial silicon substrate can be sequentially washed with acetone, isopropanol, deionized water, alcohol, and deionized water. In the aforementioned metal-assisted chemical etching process, the concentration of the hydrofluoric acid in the mixed solution can be 4.4 M to 4.8 M, the concentration of the silver nitrate in the mixed solution can be 0.008 M to 0.012 M, and the aforementioned metal-assisted chemical etching process can be performed at room temperature (for example, 20° C. to 40° C.) for 50 seconds to 70 seconds. By using the metal-assisted chemical etching process to form the plurality of microstructures 12, the noble metal silver can be deposited on the initial silicon substrate as a catalyst, and the hydrofluoric acid can be used as an etching solution, which has the advantages of simple operation, low cost, fast reaction time and high selectivity.

Step 112 can be a wet oxidation process. For example, the product of Step 111 can be placed in a nitric acid solution for oxidation, so that a portion of at least one of the microstructures 12 is oxidized to form the oxide layer 12a. Before Step 112 is performed, the product of Step 111 can be washed. For example, the product of Step 111 can be placed in a mixed solution of hydrofluoric acid and nitric acid to remove the metal silver on the surface of microstructures 12, wherein the concentration of the hydrofluoric acid is 0.22 M, the concentration of the nitric acid is 12 M, and the product of Step 111 can be placed in the mixed solution at room temperature (such as 20° C. to 40° C.) for 10 seconds to 20 seconds. In the wet oxidation process, the concentration of the nitric acid solution can be 15.5 wt % to 17.5 wt %, and it can be performed at room temperature (such as 20° C. to 40° C.) for 57 seconds to 63 seconds. Thereby, it is beneficial to control the thickness T2 of the oxide layer 12a in a predetermined range, which is beneficial to improve the responsivity of the subsequently formed organic/inorganic composite structure 1a, 1b to energy in a specific range.

Please refer back to FIG. 2. The thickness T1 of the conductive polymer layer 20 can be 100 nm to 200 nm. The spaced distance S1 can be 250 nm to 350 nm. That is, the conductive polymer layer 20 contacts the microstructures 12, but does not contact the surface 14 of the silicon substrate 10 where the silicon substrate 10 directly contacts the bottom end 12B of the microstructure 12. In addition, the conductive polymer layer 20 preferably wraps a portion of the microstructures 12. The conductive polymer layer 20 does not completely wrap the microstructures 12.

The material of the conductive polymer layer 20 can include p-type conductive polymer. For example, the material of the conductive polymer layer 20 can include poly(3,4-ethylenedioxythiophene)-poly(styrenesulfonate) (PEDOT:PSS), poly(3-hexylthiophene) (P3HT), poly[2,5-(2-octyldodecyl)-3,6-diketopyrrolopyrrole-alt-5,5-(2,5-di(thien-2-yl)thieno[3,2-b]thiophene)] (DPP-DTT), poly{2,2'-[(2,5-bis(2-hexyldecyl)-3,6-dioxo-2,3,5,6-tetrahydropyrrolo[3,4-c]pyrrole-1,4-diyl)dithiophene]-5,5'-diyl-alt-thiophen-2,5-diyl} (PDPP3T), and poly[2,6-(4,4'-bis(2-ethylhexyl)dithieno[3,2-b:2',3'-d]silole)-alt-4,7-(2,1,3-benzothiadiazole)] (PSBTBT).

The conductive polymer layer 20 can be formed on the plurality of microstructures 12 by a spin coating method. Thereby, it has the advantage of simple manufacturing process. For example, the material of the conductive polymer layer 20 can be dissolved by a solvent such as ethylene glycol to form a polymer spin coating solution, wherein the material of the conductive polymer layer 20 is 91 to 95 parts by weight, and the solvent is 5 to 9 parts by weight. After the polymer spin coating solution is spin coated on the plurality of microstructures 12, a baking step may be performed to remove the solvent in the polymer spin coating solution and to allow the conductive polymer layer 20 to solidify to form a film. The spin coating method can be a two-stage coating method, which can include a first spin coating step and a second spin coating step. The first spin coating step is performed with a first rotational speed for a first time, and the second spin coating step is performed with a second rotational speed for a second time. The first rotational speed is greater than the second rotational speed, and the first time is less than the second time. By applying the second spin coating step, the thickness of the film can be maintained and the volatilization time for the polymer spin coating solution can be provided, so that the conductive polymer layer 20 can have a uniform structure. For example, the first spin coating step can be performed with a rotational speed of 7000 rpm (revolutions per minute) to 9000 rpm for 10 seconds, and the second spin coating step can be performed with a rotational speed of 400 rpm to 600 rpm for 50 seconds. The spin coating method can be performed at room temperature. The aforementioned baking step can be performed at 130° C. to 150° C. for 12 minutes to 18 minutes, but not limited thereto. For example, the temperature and the time of the baking step can be adjusted according to the type and amount of solvent of the polymer spin coating solution.

The conductive electrodes 30 include a first conductive electrode 31 and a second conductive electrode 32, and can be formed by an evaporation process or a sputtering process. The evaporation process can be, for example, an electron beam evaporation process. By disposing the two conductive electrodes 30, it is beneficial to electrically connect the organic/inorganic composite structure 1a, 1b with other components (such as a power module). The material of the conductive electrodes 30 may include silver, gold, aluminum or a combination thereof. There may be a spaced distance S2 between the first conductive electrode 31 and the second conductive electrode 32. The spaced distance S2 may be 0.65 mm to 0.75 mm. Thereby, the spaced distance S2 is proper, so that a precise and expensive lithography process is not necessary, and the change of the concentration of carriers can be effectively sensed. When the spaced distance S2 is too small, a short-circuit current may occur, and when the spaced distance S2 is too large, the current signal may be reduced. Each of the conductive electrodes 30 is exemplary a strip structure. The strip structure has a first length L2, a second length L3 and a thickness T3. The first length L2 can be 3.9 mm to 4.1 mm, the second length L3 can be 0.2 mm to 0.3 mm, and the thickness T3 can be 140 nm to 160 nm. That is, an area of the strip structure in a top view (the viewing angle is opposite to the direction of the normal N of the surface 14 of the silicon substrate 10) can be 0.78 mm$^2$ to 1.23 mm$^2$. Thereby, the area of the conductive electrode 30 is proper, which can effectively collect electronic signals (such as the current signal). When the area is too small, the manufacturing cost may be increased, and when the area is too large, the power loss may be increased. Moreover, the thickness T3 of the conductive electrode 30 is proper, so that the conductive electrode 30 can be formed to have a uniform and flat surface by the manufacturing process. When the thickness T3 is too small, the distribution of metal may be uneven, and when the thickness T3 is too large, the shielding loss and power loss will be increased. In other embodiments, the conductive electrodes 30 can be formed in other shapes. When the conductive electrodes 30 are formed in other shapes, the area of each of the conductive electrodes 30 can also be 0.78 mm$^2$ to 1.23 mm$^2$.

As shown in FIG. 2, when the method 100 for manufacturing the organic/inorganic composite structure does not include Step 130, the product of the method 100 for manufacturing the organic/inorganic composite structure is the organic/inorganic composite structure 1a. The organic/inorganic composite structure 1a includes the silicon substrate 10 and the conductive polymer layer 20. When the method 100 for manufacturing the organic/inorganic composite structure includes Step 130, the product of the method 100 for manufacturing the organic/inorganic composite structure is the organic/inorganic composite structure 1b. The organic/inorganic composite structure 1b may include the silicon substrate 10, the conductive polymer layer 20 and the two conductive electrodes 30.

<Organic/Inorganic Composite Structure>

According to the present disclosure, an organic/inorganic composite structure is provided, such as the organic/inorganic composite structure 1a and the organic/inorganic composite structure 1b shown in FIG. 2.

As shown in FIG. 2 and FIG. 3, the organic/inorganic composite structure 1a includes a silicon substrate 10 and a conductive polymer layer 20. The silicon substrate 10 includes a plurality of microstructures 12 disposed on a surface 14 of the silicon substrate 10. The conductive polymer layer 20 is disposed on the plurality of microstructures 12. A spaced distance S1 is between the conductive polymer layer 20 and the surface 14 of the silicon substrate 10. The main difference between the organic/inorganic composite structure 1b and the organic/inorganic composite structure 1a is that the organic/inorganic composite structure 1b further includes two conductive electrodes 30 disposed on a surface 22 of the conductive polymer layer 20 away from the plurality of microstructures 12 and the two conductive electrodes 30 are spaced apart with each other. Each of the organic/inorganic composite structures 1a and 1b shows responsivity to energy in a specific range, and can be applied as a sensing device.

For details of the organic/inorganic composite structures 1a and 1b, reference may be made to above relevant description. For the application of the organic/inorganic composite structures 1a and 1b as sensing devices, reference may be made to the following relevant description. Therefore, the details and the application of the organic/inorganic composite structures 1a and 1b are omitted herein.

<Sensing Device>

According to the present disclosure, a sensing device is provided. The sensing device includes an organic/inorganic composite structure, organic/inorganic composite structure shows responsivity to energy in a specific range, and can be applied as a sensing device, such as a light sensing device.

Figure 5:
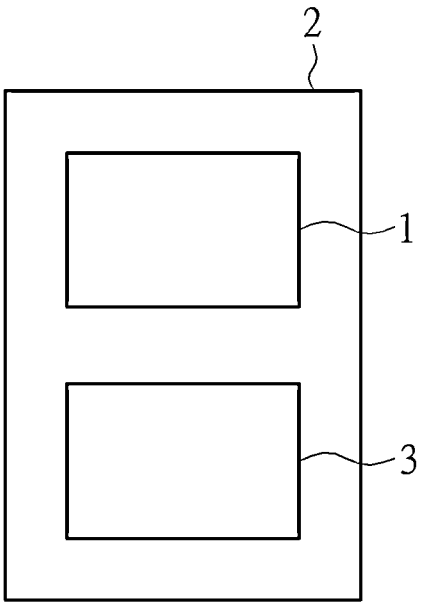
FIG. 5 is a functional block diagram of a sensing device according to one embodiment of the present disclosure.

Please refer to FIG. 5, which is a functional block diagram of a sensing device 2 according to one embodiment of the present disclosure. The sensing device 2 includes an organic/inorganic composite structure 1 and a power module 3. The power module 3 is electrically connected with the organic/inorganic composite structure 1. The power module 3 is configured to provide a potential difference/power to the organic/inorganic composite structure 1. The organic/inorganic composite structure 1 may be the aforementioned organic/inorganic composite structure 1a or the aforementioned organic/inorganic composite structure 1b.

Figure 6:
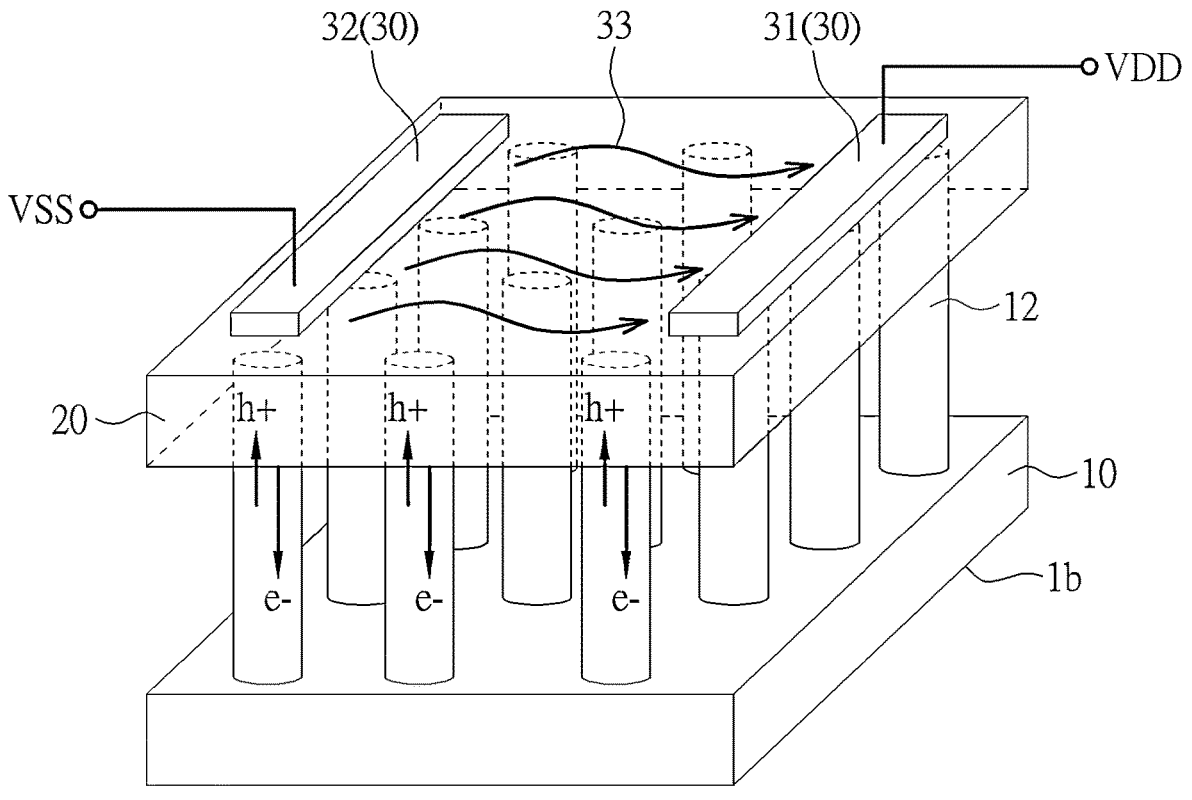
FIG. 6 is a schematic diagram showing electrons, electron holes and current in an organic/inorganic composite structure according to one embodiment of the present disclosure.

Please refer to FIG. 6, which is a schematic diagram showing electrons e⁻, electron holes h⁺ and current 33 (also called photocurrent) in the organic/inorganic composite structure 1b according to one embodiment of the present disclosure. The first conductive electrode 31 is connected with the power supply VDD of the power module (not shown), and the second conductive electrode 32 is connected with the reference potential VSS (such as ground potential) of the power module (not shown). When a voltage is provided by the power supply VDD, a current channel can be formed on the surface. In FIG. 6, the power supply VDD provides a negative bias voltage, which is exemplary. When energy in a specific range is absorbed, the electron hole h⁺ moves upwardly and the electron e⁻ moves downwardly, which causes the change of the concentration of carriers (i.e., electron holes h⁺ and electrons e⁻) in the conductive polymer layer 20, so that a signal change is generated by the current 33. The direction of the current 33 is from the reference potential VSS to the second conductive electrode 32, the first conductive electrode 31 and the power supply VDD in sequence, and the current channel can be formed in the organic/inorganic composite structure 1b between the first conductive electrode 31 and the second conductive electrode 32. According to the function of the organic/inorganic composite structure 1b, the organic/inorganic composite structure 1b can be regarded as a transistor, and the first conductive electrode 31 and the second conductive electrode 32 can be regarded as a drain and a source of the transistor, respectively. Therefore, the organic/inorganic composite structure 1b can be used as a switch and a source of digital signals. As for the method for manufacturing conventional transistors, an epitaxial process or a bonding process is commonly used, which requires expensive instruments and equipment. Compared with the method for manufacturing the conventional transistors, the method 100 for manufacturing the organic/inorganic composite structure according to the present disclosure does not require to use the expensive instruments and equipment, which is beneficial to reduce the manufacturing costs.

The aforementioned energy in a specific range may be 1 mW/cm² to 30 mW/cm², and may be provided by light with a specific wavelength range. In other words, the sensing device 2 according to the present disclosure may be a light sensing device. The aforementioned specific wavelength range may be 580 nm to 600 nm. That is, the sensing device 2 according to the present disclosure can be used to sense light with the wavelength of 580 nm to 600 nm.

Preparation and Property Measurement of Examples

Example 1: a silicon substrate is provided (Step 110), which includes steps as follows. A single side polished (SSP) silicon wafer is used as an initial silicon substrate, the specifications of which are shown in Table 1.

TABLE 1

| Growth Method | CZ |
|---|---|
| Type | N |
| Orientation | <100> |
| Thickness | $525 \pm 25$ (μm) |
| Diameter | $100 \pm 0.4$ (mm) |
| Resistivity | $0.1 - 0.5$ (Ω · cm) |

The SSP silicon wafer is sequentially washed with acetone, isopropanol, deionized water, alcohol and deionized water, and then immersed in a mixed solution of silver nitrate and hydrofluoric acid to react at room temperature for 60 seconds to form a plurality of nanowires on the SSP silicon wafer (Step 111), wherein the concentration of the silver nitrate is 0.01 M, and the concentration of the hydrofluoric acid is 4.6 M. Afterwards, the SSP silicon wafer is immersed in a mixed solution of hydrofluoric acid and nitric acid to react at room temperature for 15 seconds to remove metal silver on the surface, wherein the concentration of the hydrofluoric acid is 0.22 M, and the concentration of the nitric acid is 12 M. Then the SSP silicon wafer in immersed in a nitric acid solution with a concentration of 16.5 wt % at room temperature for 60 seconds to oxidize a portion of the nanowire to form an oxide layer (Step 112), so as to complete the manufacture of the silicon substrate. Please refer to Table 2, the reactions of Step 111 are shown in Formula (1) to Formula (2), and the reaction of Step 112 is shown in Formula (3).

TABLE 2

| Formula (1) | $Si_{(s)} + 4AgNO_{3(aq)} + 6HF_{(aq)} \rightarrow 4Ag_{(s)} + 4HNO_{3(aq)} + H_2SiF_{6(aq)}$ |
|---|---|
| Formula (2) | $SiO_{2(s)} + 2H_2O_{(l)} + 6HF_{(s)} \rightarrow H_2SiF_{6(s)} + 4H_2O_{(l)}$ |
| Formula (3) | $Si_{(s)} + 4HNO_{3(aq)} \rightarrow SiO_{2(s)} + 2H_2O_{(l)} + 4NO_{2(g)}$ |

Next, a conductive polymer layer is formed on the plurality of microstructures (Step 120), which includes steps as follows. PEDOT:PSS aqueous solution (PH 1000; CAS: 155090-83-8), ethylene glycol (CAS: 107-21-1) are mixed at a weight ratio of 91-95 to 5-9 and stirred with a magnet and a magnetic stirrer at a rotational speed of 400 rpm for 1 day to form a polymer spin coating solution. The SSP silicon wafer is placed on a turntable, and the polymer spin coating solution is coated on the nanowires of the silicon substrate at a rotational speed of 8000 rpm for 10 seconds and a rotational speed of 500 rpm for 50 seconds under room temperature. Afterward, a baking step is performed at 140° C. for 10 minutes to complete the manufacture of the conductive polymer layer to obtain the first organic/inorganic composite structure (the structure thereof may refer to the organic/inorganic composite structure 1a above).

Next, two conductive electrodes are formed on the surface of the conductive polymer layer away from the plurality of microstructures (Step 130). Specifically, the first organic/ inorganic composite structure is placed in an evaporation system, the evaporation material is silver, the evaporation process is performed under a vacuum degree of 5E-6 torr to 7E-6 torr and an evaporation temperature of 280° C. to 315° C., so as to complete the manufacture of the conductive electrodes to obtain the second organic/inorganic composite structure (the structure thereof may refer to the organic/inorganic composite structure 1b above). In the present disclosure, whether to form the conductive electrodes can be determined according to subsequent applications. In other words, the organic/inorganic composite structure according to the present disclosure can be the first organic/inorganic composite structure or the second organic/inorganic composite structure.

Figure 7:
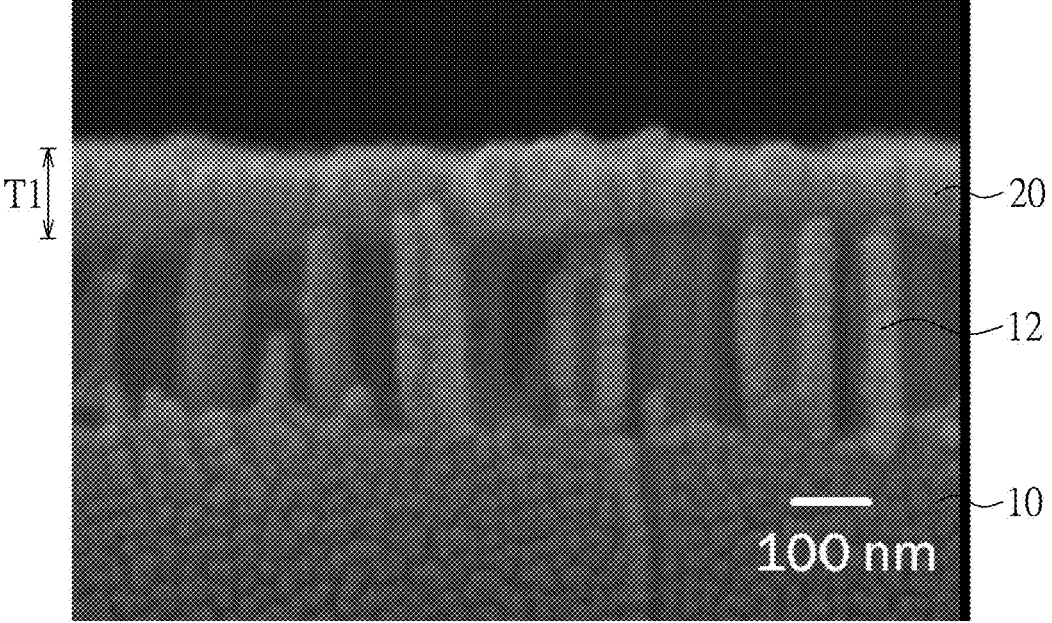
FIG. 7 is a scanning electron microscope (SEM) image of a second organic/inorganic composite structure of Example 1 according to the present disclosure.

The second organic/inorganic composite structure of Example 1 is further processed to form a SEM specimen and a TEM specimen and observed by a SEM and a TEM. Please refer to FIG. 7, which is a SEM image of the second organic/inorganic composite structure of Example 1 according to the present disclosure. In FIG. 7, the silicon substrate 10 includes a plurality of microstructures 12, and the conductive polymer layer 20 is disposed on the plurality of microstructures 12. The diameters of the microstructures 12 are about 20 nm, and the lengths of the microstructures 12 are about 400 nm. The thickness T1 of the conductive polymer layer 20 is about 100 nm to 200 nm. In addition, it should be noted that when forming the SEM specimen and the TEM specimen, gold particles are deposited on the second organic/inorganic composite structure in order to increase the conductivity and improve the clarity of the SEM and TEM images. The round particles in the silicon substrate 10 in FIG. 7 are the images of the gold particles.

Figure 8:
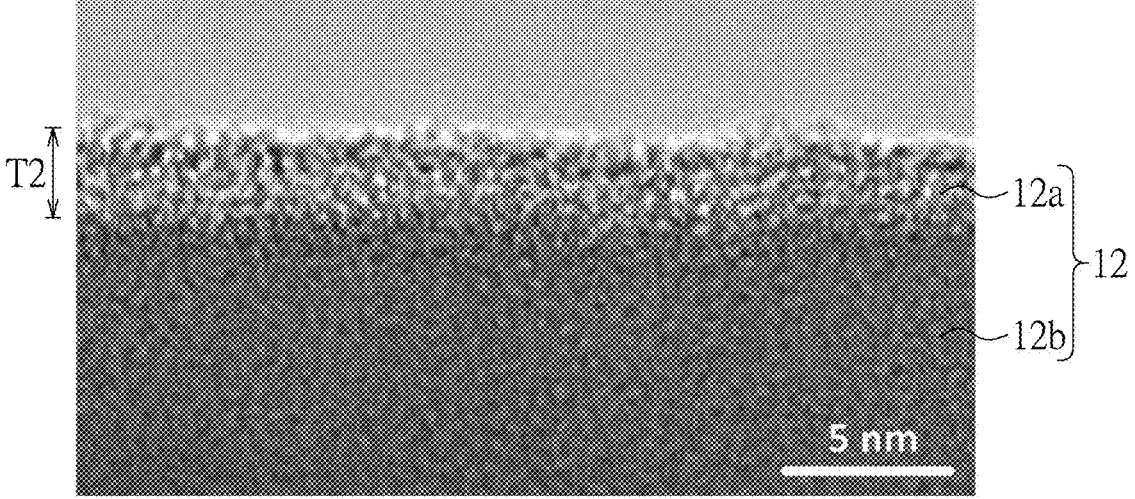
FIG. 8 is a transmission electron microscope (TEM) image of a portion of a microstructure of Example 1 according to the present disclosure.

Please refer to FIG. 8, which is a TEM image of a portion of a microstructure 12 of Example 1 according to the present disclosure. In FIG. 8, the microstructure 12 includes an oxide layer 12a and a non-oxidized portion 12b. The thickness T2 of the oxide layer 12a is about 2.6 nm to 3.0 nm, and an average thickness is about 2.8 nm.

The second organic/inorganic composite structures of Examples 2 to 4 are obtained by changing the time of Step 112 of Example 1 from 60 seconds to 0 seconds, 180 seconds and 300 seconds, respectively. The thicknesses of the oxide layers of Examples 2 to 4 are observed by TEM. The thicknesses of the oxide layers of Examples 1-4 are listed in Table 3.

TABLE 3

|  | Example 2 | Example 1 | Example 3 | Example 4 |
|---|---|---|---|---|
| Time of Step 112 (S) | 0 | 60 | 180 | 300 |
| Thickness (nm) | 0-0.2 | 2.6-3.0 | 4.0-4.2 | 5.3-5.7 |

Figure 9:
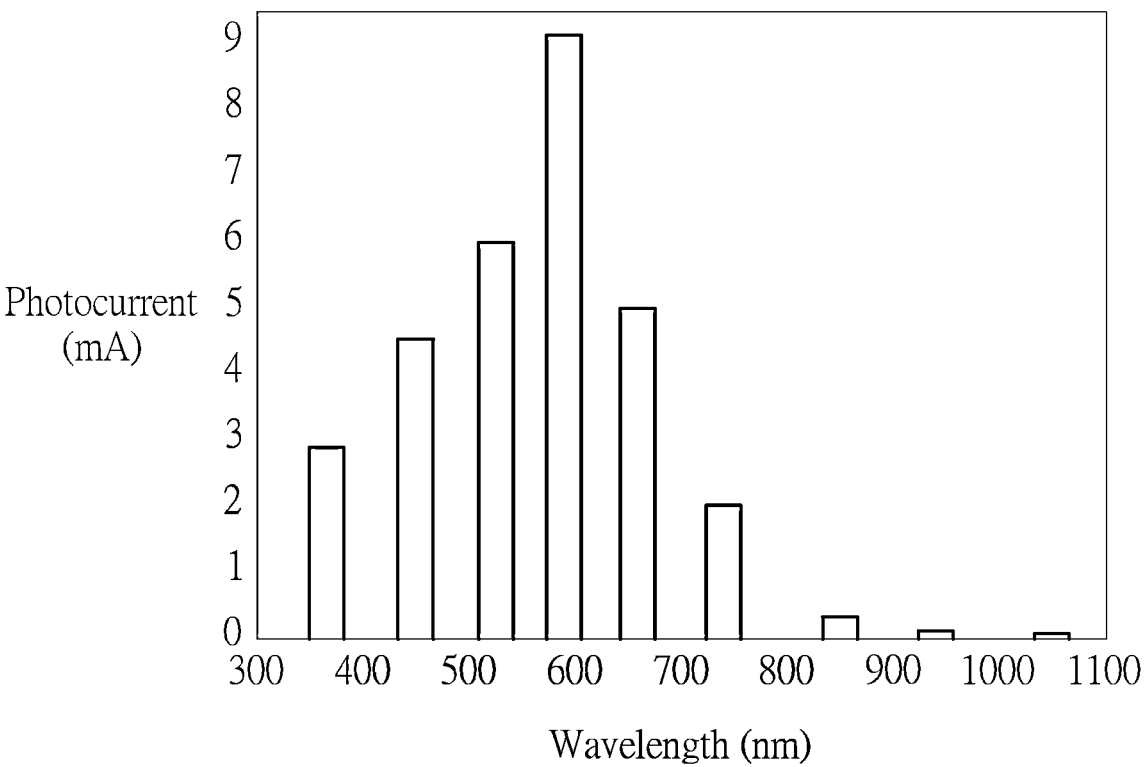
FIG. 9 shows photocurrents of Example 1 according to the present disclosure generated by irradiating lights with different wavelengths.

The measurement of photocurrent of the second organic/inorganic composite structure of Example 1 is performed, in which the second organic/inorganic composite structure of Example 1 is connected with a resistor, an amperemeter and a power module in series. The resistor is for adjusting the magnitude of current (such as the photocurrent). Herein, the photocurrent is measured when the power module provides a negative bias voltage of 1V to 3V, and the resistor is 2 k ohms to 3 k ohms, but not limited thereto. Next, lights with wavelengths of 355 nm to 375 nm, 440 nm to 460 nm, 515 nm to 535 nm, 580 nm to 600 nm, 650 nm to 670 nm, 730 nm to 750 nm, 840 nm to 860 nm, 930 nm to 950 nm and 1040 nm to 1060 nm are used to irradiate the second organic/inorganic composite structure of Example 1, and the magnitudes of the photocurrent measured by the amperemeter are read. Please refer to FIG. 9, which shows photocurrents of Example 1 according to the present disclosure generated by irradiating lights with different wavelengths. As shown in FIG. 9, the second organic/inorganic composite structure of Example 1 shows responsivity to the light with the wavelength of 355 nm to 750 nm, and shows excellent responsivity to the light with the wavelength of 580 nm to 600 nm. That is, the second organic/inorganic composite structure of Example 1 has wavelength selectivity.

Next, the photocurrents of the second organic/inorganic composite structures of Examples 1 to 4 generated by irradiating the light with the wavelength of 580 nm to 600 nm are measured, and the measurement method may refer to that of FIG. 9. The results are shown in Table 4.

TABLE 4

|  | Example 2 | Example 1 | Example 3 | Example 4 |
|---|---|---|---|---|
| Photocurrent (mA) | 2.5 | 9.1 | 0.7 | 1.6 |

As shown in Table 4, Examples 1 to 4 all can generate photocurrents after irradiating the light with the wavelength of 580 nm to 600 nm. Among Examples 1 to 4, the photocurrent of Example 1 is the largest, which shows that when the thickness of the oxide layer of the microstructure falls within a specific range, it is beneficial to improve the responsivity of the second organic/inorganic composite structure to the light with the wavelength of 580 nm to 600 nm. Accordingly, it is beneficial for the second organic/inorganic composite structure being applied as a light sensing device. The thickness of the oxide layer can be determined by the time of Step 112.

Figure 10:
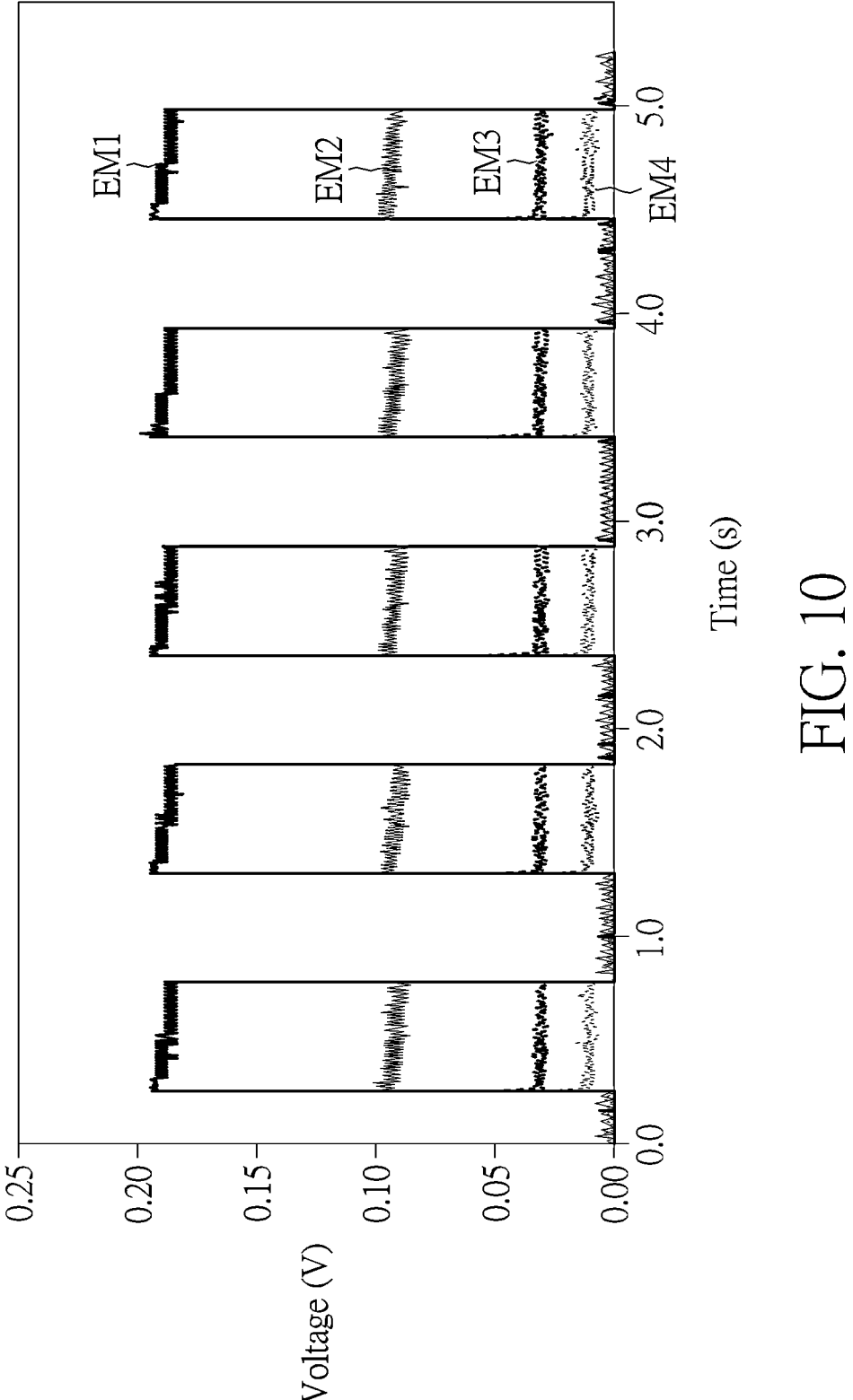
FIG. 10 shows voltages of Examples 1, 2, 3 and 4 generated by irradiating a light with a wavelength of 580 nanometers (nm) to 600 nm.

Next, voltages of Examples 1 to 4 generated by irradiating the light with the wavelength of 580 nm to 600 nm are measured. The difference between the measurement method of the voltage and the measurement method of the photocurrent is to replace the amperemeter connected in series with an oscilloscope connected in parallel, and the results are shown in FIG. 10. Please refer to FIG. 10, which shows voltages of Examples 1, 2, 3 and 4 generated by irradiating the light with the wavelength of 580 nm to 600 nm. The square wave EM1 represents the voltage of Example 1, the square wave EM2 represents the voltage of Example 2, the square wave EM3 represents the voltage of Example 3, and the square wave EM4 represents the voltage of Example 4. As shown in FIG. 10, Examples 1 to 4 all can generate voltages. Among Examples 1 to 4, the voltage of Example 1 is the largest, which shows that when the thickness of the oxide layer of the microstructure falls within a specific range, it is beneficial to improve the responsivity of the second organic/inorganic composite structure to the light with the wavelength of 580 nm to 600 nm. Accordingly, it is beneficial for the second organic/inorganic composite structure being applied as a light sensing device.

Compared with the prior art, the organic/inorganic composite structure according to the present disclosure uses the silicon substrate and the conductive polymer as materials, which has the advantages of easy acquisition and low price. The method for manufacturing the organic/inorganic composite structure according to the present disclosure does not require to use expensive instruments and equipment, which is beneficial to reduce the manufacturing cost. The organic/inorganic composite structure according to the present disclosure shows responsivity to energy in a specific range and can be applied as a sensing device. The organic/inorganic composite structure shows responsivity to light with a specific wavelength range and can be applied as a light sensing device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An organic/inorganic composite structure, comprising:
   a silicon substrate comprising a plurality of microstructures disposed on a surface of the silicon substrate; and
   a conductive polymer layer disposed on the plurality of microstructures, wherein a spaced distance is between the conductive polymer layer and the surface of the silicon substrate.

2. The organic/inorganic composite structure of claim 1, wherein at least one of the plurality of microstructures has an oxide layer.

3. The organic/inorganic composite structure of claim 2, wherein a thickness of the oxide layer is 2.5 nm to 3 nm.

4. The organic/inorganic composite structure of claim 2, wherein the plurality of microstructures are integrally formed on the silicon substrate, and the oxide layer comprises an oxide of silicon.

5. The organic/inorganic composite structure of claim 1, wherein the silicon substrate is an n-type silicon substrate, and the material of the conductive polymer layer comprises a p-type conductive polymer.

6. The organic/inorganic composite structure of claim 1, wherein each of the plurality of microstructures is a nanowire.

7. The organic/inorganic composite structure of claim 6, wherein a diameter of the nanowire is 20 nm to 25 nm, and a length of the nanowire is 350 nm to 450 nm.

8. The organic/inorganic composite structure of claim 1, wherein a thickness of the conductive polymer layer is 100 nm to 200 nm.

9. The organic/inorganic composite structure of claim 1, further comprising:
   two conductive electrodes disposed on a surface of the conductive polymer layer away from the plurality of microstructures and are spaced apart with each other.

10. A method for manufacturing an organic/inorganic composite structure, comprising:
   providing a silicon substrate, wherein the silicon substrate comprising a plurality of microstructures disposed on a surface of the silicon substrate; and forming a conductive polymer layer on the plurality of microstructures, wherein a spaced distance is between the conductive polymer layer and the surface of the silicon substrate.

11. The method for manufacturing the organic/inorganic composite structure of claim 10, wherein providing the silicon substrate comprises:
   performing an etching step, wherein the plurality of microstructures are formed on the surface of the silicon substrate.

12. The method for manufacturing the organic/inorganic composite structure of claim 11, wherein the etching step is a metal-assisted chemical etching process.

13. The method for manufacturing the organic/inorganic composite structure of claim 11, wherein providing the silicon substrate further comprises:
   performing an oxidation step, wherein a portion of at least one of the plurality of microstructures is oxidized to form an oxide layer.

14. The method for manufacturing the organic/inorganic composite structure of claim 13, wherein the oxidation step is a wet oxidation process.

15. The method for manufacturing the organic/inorganic composite structure of claim 10, wherein the conductive polymer layer is formed on the plurality of microstructures by a spin coating method.

16. The method for manufacturing the organic/inorganic composite structure of claim 15, wherein the spin coating method comprises a first spin coating step and a second spin coating step, the first spin coating step is performed with a first rotational speed for a first time, the second spin coating step is performed with a second rotational speed for a second time, the first rotational speed is greater than the second rotational speed, and the first time is less than the second time.

17. The method for manufacturing the organic/inorganic composite structure of claim 10, further comprises:
   forming two conductive electrodes on a surface of the conductive polymer layer away from the plurality of microstructures, wherein the two conductive electrodes are spaced apart with each other.

18. A sensing device, comprising the organic/inorganic composite structure of claim 1.

19. The sensing device of claim 18, wherein the sensing device is used to sense a light with a wavelength of 580 nm to 600 nm.

* * * * *